United States Patent [19]
Deinhardt et al.

[11] Patent Number: 5,249,979
[45] Date of Patent: Oct. 5, 1993

[54] SELF-MOUNTING BUS

[75] Inventors: Günther Deinhardt, Amberg; Reinhard Schirbl, Schwandorf, both of Fed. Rep. of Germany

[73] Assignee: Siemens Aktiengesellschaft, Munich, Fed. Rep. of Germany

[21] Appl. No.: 923,286

[22] Filed: Jul. 31, 1992

[30] Foreign Application Priority Data

Aug. 8, 1991 [EP] European Pat. Off. ........ 91113357.7

[51] Int. Cl.⁵ .............................................. H01R 4/50
[52] U.S. Cl. .................................... 439/341; 439/716; 439/928; 361/729
[58] Field of Search ............... 361/331, 334, 393-396, 361/399, 413, 427; 439/341, 715, 716, 928

[56] References Cited

U.S. PATENT DOCUMENTS

| | | | |
|---|---|---|---|
| 2,910,630 | 10/1959 | Hammerly | 439/715 X |
| 4,401,351 | 8/1983 | Record | 361/393 X |
| 4,477,862 | 10/1984 | Gonzales | 361/393 |
| 4,738,632 | 4/1988 | Schmidt et al. | 439/341 |
| 4,790,762 | 12/1988 | Harms et al. | 439/59 |
| 4,865,560 | 9/1989 | Thomas | 439/341 |

FOREIGN PATENT DOCUMENTS

| | | |
|---|---|---|
| 0236711 | 9/1987 | European Pat. Off. . |
| 0364618 | 4/1990 | European Pat. Off. . |
| 0211875 | 8/1989 | Japan ................................... 439/341 |

*Primary Examiner*—Larry I. Schwartz
*Assistant Examiner*—Khiem Nguyen
*Attorney, Agent, or Firm*—Kenyon & Kenyon

[57] ABSTRACT

In the case of a modular electrical installation, for instance a modular programmable controller, the bus is modularly configured on the modules, so that the bus is automatically propagated when the installation is assembled.

14 Claims, 1 Drawing Sheet

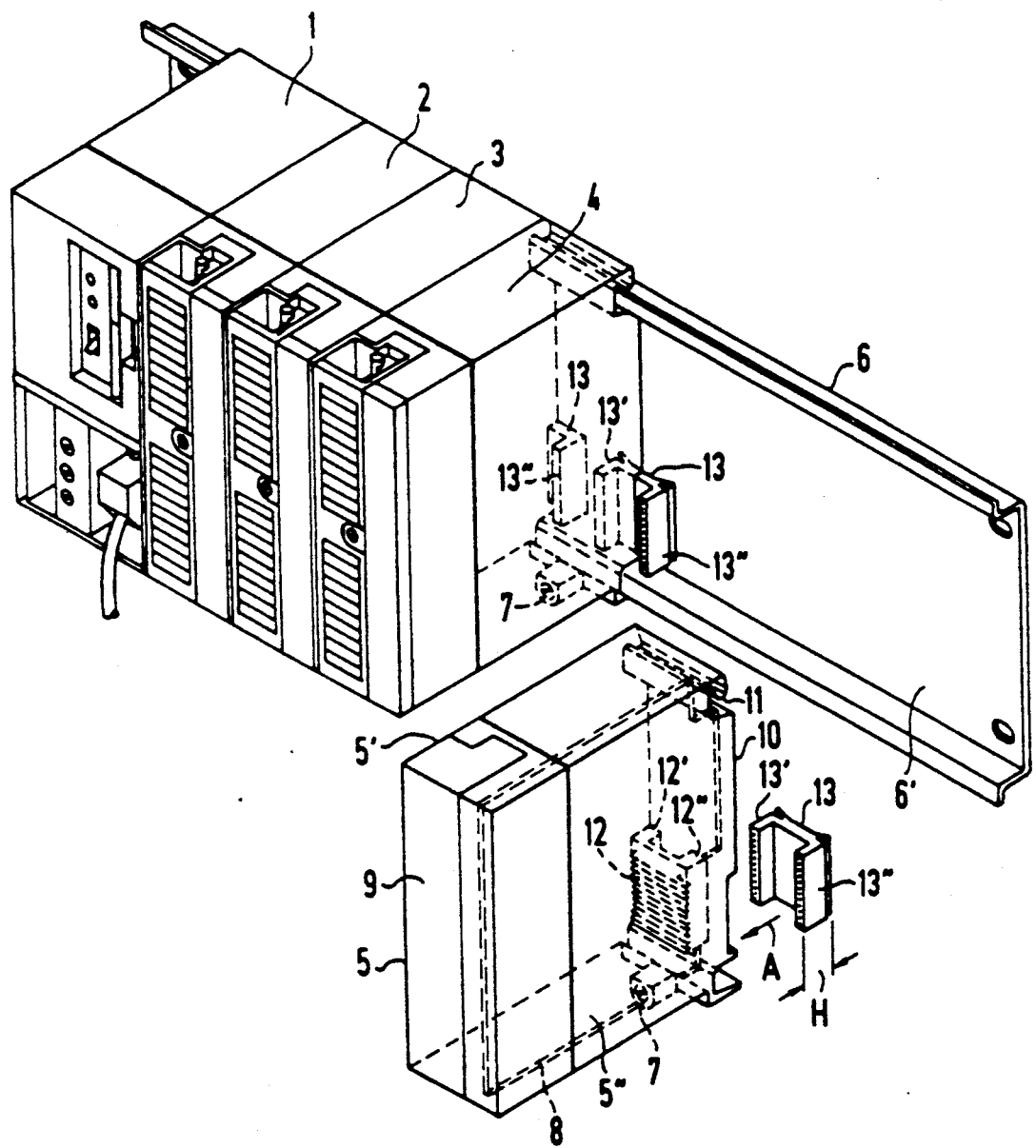

SELF-MOUNTING BUS

BACKGROUND OF THE INVENTION

The present invention relates to an electrical installation comprising several modules, preferably a modular programmable controller, whose preferably encapsulated modules are able to be electrically interconnected via bus units.

The U.S. Pat. No. 4,477,862 discloses an installation, wherein the backplane bus units are integrated in a modular subrack, so that the subracks have to be mounted individually on a wall, for example. One problem with this device is that removing individual modules of the backplane bus as needed from the assembled backplane bus is not possible. Moreover, the width of the modules must conform with the width of the subrack.

The object of the present invention is to produce an installation of several modules which minimizes the basic expenditure for the bus connection, in which the individual modules can have differing widths, in which modules located between other modules may be easily replaced, and in which the bus connection follows automatically when the modules are plugged in or pivoted on to a carrier even without a preassembled backplane bus. The present invention also seeks the ability to add modules later.

SUMMARY OF THE INVENTION

The present invention achieves the aforementioned objective by arranging bus units on the modules in a way that allows adjacent modules to be forcibly electrically-conductively interconnected when the modules are assembled.

By configuring the bus units at the backplane of the modules, the present invention protects them during operation of the system from possible accidental damage caused, for example, by the user. If the modules contain printed-circuit boards, the present invention protects the printed circuit boards from mechanical stress occurring during the assembly of the modules by advantageously supporting the bus units in the modules in a way that allows them to be mechanically braced in the modules.

By having each bus unit consist of one module modular part and one connecting modular part such that the modular component for the module is permanently allocated to one of the modules and the connecting modular part is removably allocated to one or two of the modules, the present invention permits centrally situated modules and connecting modular parts to be exchanged without having to disassemble the entire installation. The module modular part and the connecting modular part of the present invention are preferably constructed to be both mechanically and electrically symmetrical so the parts can then be assembled in any way desired.

By designing the bus units to be braced on a supporting device when the installation is assembled, the present invention reduces the mechanical stresses to the bus unit to a minimum when the modules are assembled.

BRIEF DESCRIPTION OF THE DRAWING

Further advantages and details are revealed in the following description of an exemplified embodiment, based on the drawing.

The Figure depicts a modular programmable controller with bus units configured on the modules.

DETAILED DESCRIPTION

According to the Figure, the central processing unit (CPU) 1 as well as the interface modules 2–4 of a modular programmable controller are positioned next to each other and are pivoted on to a carrier 6. The carrier may be a top-hat rail for example. After the swivel-mounting, the CPU 1 and the interface modules 2–4 are secured to the carrier by means of screw connections 7. The modules are designed as encasing housing enclosures which protect the contents (e.g., printed circuit boards 8) of the modules 2–5 from damage. At the same time, the encasing housing enclosure also exactly defines the module width. As is clearly apparent from the Figure, the overall width of the central processing unit 1 is considerably greater than that of any one of the interface modules 2–5.

As is furthermore apparent from the Figure, the modules 2–5 exhibit a service side 9 for permitting external wiring to be connected. The modules 2–5 also include a backplane 10 on a side of the module opposite that of the service side 9. After swivel-mounting, a portion of the backplane 10 extending outward in the direction of the top-hat rail 6 preferably abuts the top-hat rail. Configured at the upper end of the backplane 10 is a hook mechanism 11, on which the modules 2–5 may pivotally hang from the top-hat rail 6. Furthermore, the bus connection of the modules 2–5 is mounted on the backplane 10. Each module 2–5 includes a bus unit each of which include a module modular part 12 and a connecting modular part 13. The module modular part 12 and the connecting modular part 13 are arranged at the end of the backplane 10 opposite that of the hook mechanism 11.

The modular parts 12 are permanently fixed in the modules 2–5 and are braced in the modules 2–5. As a result, the printed circuit boards 8 contained in the modules 2–5 are not affected by mechanical stresses occurring during assembly. However, the module modular parts 12 are, of course electrically connected to the printed circuit boards 8. The connecting modular parts 13 are removably allocated to the modules 2–5. The modular parts are preferably plug-in type parts. The insertion of a modular part 13 onto a module is essentially linear as indicated by the arrow A for module 5.

Both the module modular part 12, as well as the connecting modular part 13 have a U-shape and both are constructed to be electrically as well as mechanically symmetrical. Consequently, the connecting modular part 13 can be inserted with each of its limbs 13', 13" into each of the limb receptacles 12', 12". Either of these connecting possibilities provides a correct bus connection.

The module modular part 12 is designed so that, independent of the width of the modules, for instance of the module 5, the limb receptacles 12', 12" are always the same distance from the nearest side wall, for instance the side walls 5', 5" of the module 5. The connecting modular part 13 is designed to exactly bridge the distance between two limb receptacles 12', 12" and the side walls of the modules (e.g., the side walls 5', 5"). The bus connection is established thereby by electrically and mechanically interconnecting, in turn, a limb of one module modular part 12 (e.g., 12") to a limb of one connecting modular part 13 (e.g., 13'), etc.

Preferably, the overall height H of the connecting modular part 13 is such that its bottom surface is braced against the front side surface 6' of the top-hat rail 6 in the assembled state of the programmable controller. This reduces mechanical stress to the connecting modular part 13, for example when the module 5 is swivel-mounted.

A preferred method of assembly of the overall system is described below. The programmable controller is preferably assembled in a way that allows the left limb 13' of the associated connecting modular parts 13 to be inserted into the modules 2-5, in each case into the right limb receptacle 12", so that the right limb 13" projects from the right rear of the modules 2-5 as shown for module 4. The modules 2, 3, 4 and 5 are then swivel-mounted one after another, side-by-side, on to the top-hat rail 6. The swivel-mounting forcibly establishes the electrically conductive connection among adjacent modules (i.e., the right limbs of the connecting modular parts 13" are forced to connect with the left limbs 12' of the module modular parts).

for the first time, the above-described invention creates a mounting system, which automatically propagates its backplane bus. Therefore, a backplane bus preassembled on a subrack is not required. Furthermore, as explained above, modules of any overall width can be attached to one another thus enhancing the system's flexibility. Replacing centrally located modules (i.e., modules which are flanked to the left and right by other modules) is also possible without having to disassemble the entire system. In addition, an individual connecting modular part 13 can be replaced, in the same way, without dismantling the entire system by removing the two modules, in which it is integrated. The number of modules is limited only by the length of the top-hat rail 6 and by the drops in voltage occurring at the module boundaries due to contact resistance.

For the purposes of the present invention, the CPU 1 has properties similar to the modules 2-5.

What is claimed is:

1. An electrical installation comprising a plurality of modules and a carrier adapted to accommodate said plurality of modules, each of said plurality of modules
   having an essentially box-shaped encapsulation comprising two sidewalls and one rear wall, and
   having a bus module comprising a fixed pair of contact elements and a removable pair of contact elements,
     said fixed pair of contact elements being oriented from said rear wall towards said carrier and being located between said two sidewalls at a distance from a first of said two sidewalls,
     said removable pair of contact elements complementing said first pair of contact elements, being directed from said carrier toward said rear wall, and extending beyond a second of said two sidewalls by said distance when said module is mounted,
   whereby when the electrical installation is assembled, adjacent modules are forcibly connected to each other in an electrically conductive manner via one of said bus modules.

2. The electrical installation according to claim 1 wherein at least one of said plurality of modules contains printed circuit boards and wherein said fixed pair of contact element are mechanically braced in each of said plurality of modules.

3. The electrical installation according to claim 1, wherein one pair of said fixed pair of contact elements and one pair of said removable pair of contact elements are able to be connected with one another by an essentially linear movement.

4. The electrical installation according to claim 1, wherein said fixed pair of contact elements and said removable pair of contact elements are constructed to be mechanically and electrically symmetrical.

5. The electrical installation according to claim 1, wherein said fixed pair of contact elements are essentially U-shaped.

6. The electrical installation according to claim 1, wherein said removable pair of contact elements are essentially U-shaped.

7. The electrical installation according to claim 1 wherein when the installation is assembled, each fixed pair of contact elements is electrically and mechanically connected to up to two removable pairs of contact elements and removable pair of contact elements is electrically and mechanically interconnected to up to two fixed pairs of contact elements.

8. The electrical installation according to claim 1 further including a support mechanism having a surface wherein said bus modules are designed such that they are braced on said surface of said support mechanism when the installation is assembled.

9. The electrical installation according to claims 1, wherein each of said plurality of modules includes a hook mechanism, each hook mechanism permitting an associated module to be swivel-mounted on to said carrier.

10. The electrical installation according to claim 9 wherein said carrier is a top-hat rail.

11. The electrical installation according to claim 9 wherein for each of said plurality of modules, said hook mechanism is arranged at an end said rear wall.

12. The electrical installation according to claim 11, wherein for each of said plurality of modules said bus module is arranged at said end of said rear wall opposite the hook mechanism.

13. The electrical installation according to claim 9, further including a fastener, said fastener securing one of said plurality of modules to said carrier after said one of said plurality of modules is swivel-mounted on to said carrier.

14. The electrical installation according to claim 12, wherein one of said plurality of modules is secured to said carrier by screwing it to said carrier.

* * * * *